(12) United States Patent
Khitun et al.

(10) Patent No.: US 7,366,011 B2
(45) Date of Patent: Apr. 29, 2008

(54) POWER CONSUMPTION MINIMIZATION IN MAGNETIC RANDOM ACCESS MEMORY BY USING THE EFFECT OF HOLE-MEDIATED FERROMAGNETISM

(75) Inventors: Alexander Khitun, Los Angeles, CA (US); Kang L. Wang, Santa Monica, CA (US)

(73) Assignee: The Regents of the University of California, Oakland, CA (US)

( * ) Notice: Subject to any disclaimer, the term of this patent is extended or adjusted under 35 U.S.C. 154(b) by 209 days.

(21) Appl. No.: 11/180,955

(22) Filed: Jul. 12, 2005

(65) Prior Publication Data

US 2007/0014147 A1 Jan. 18, 2007

(51) Int. Cl.
*G11C 11/14* (2006.01)
(52) U.S. Cl. .................. 365/171; 365/173; 365/158
(58) Field of Classification Search ................ 365/171, 365/173, 158, 163, 207, 189.09
See application file for complete search history.

(56) References Cited

U.S. PATENT DOCUMENTS

| | | | | |
|---|---|---|---|---|
| 4,803,658 | A * | 2/1989 | Grimes | 365/87 |
| 6,750,491 | B2 * | 6/2004 | Sharma et al. | 257/295 |
| 6,937,434 | B2 * | 8/2005 | Takahashi | 360/112 |
| 6,954,373 | B2 * | 10/2005 | Perner | 365/158 |
| 6,956,766 | B2 * | 10/2005 | Nakamura et al. | 365/171 |
| 7,218,550 | B2 * | 5/2007 | Schwabe et al. | 365/173 |

OTHER PUBLICATIONS

D. Gidding, *Large Tunneling Anisotropic Magnetoresistance in (Ga,Mn)As Nanoconstrictions*, Apr. 1, 2005, p. 127202-1.*

Au, E.K.S., et al., *A novel current-mode sensing scheme for magnetic tunnel junction MRAM*. IEEE Transactions on magnetics2004. 40(2): p. 483-8.

Daweritz, L., et al., *Thickness dependence of the magnetic properties of MnAs films on GaAs(001)and GaAs(113)A: role of a natural array of ferromagnetic stripes*. Journal of Applied Physics, 2004. (6(9): p. 5056-62.

Daughton, *Magnetoresistive Random Access Memory (MRAM)*, pp. 1-13 (2000).

Dietl, et al., *Hole-mediated ferromagnetism in tetrahedrally coordinated semiconductors*, The American Physical Society, pp. 195205-1-195205-21 (2001).

(Continued)

*Primary Examiner*—Richard T. Elms
*Assistant Examiner*—Dang Nguyen
(74) *Attorney, Agent, or Firm*—Needle & Rosenberg, P.C.

(57) ABSTRACT

A low-power memory device that uses hole-mediated ferromagnetism creates substantial advantages over conventional systems. Some of these advantages include reducing power consumption by several orders of magnitude and facilitating wireless monitoring of memory cells. In one implementation, an electronic device is described that includes a plurality of memory cells. Each of the memory cells has a material with first and second magnetic states. The material is in the first magnetic state when a contact associated with the material is at a first voltage, and the material is in the second magnetic state when the contact is at a second voltage. A conductor is positioned proximate to and extending around the plurality of memory cells. An inductive voltage across the conductor varies when at least one of the memory cells changes magnetic state. A detection device determines the magnetic state of the memory cells based on an inductive voltage measurement.

19 Claims, 4 Drawing Sheets

OTHER PUBLICATIONS

Ferrand, et al., *Carrier-induced ferromagnetic interactions in p-doped* $Zn_{(1-x)}Mn_xTe$ *epilayers*, Journal of Crystal Growth 214/215, pp. 387-390 (2000).

Haury, et al., *Observation of a Ferromagnetic Transition Induced by Two-Dimensional Hole Gas in Modulation-Doped CdMnTe Quantum Wells*, vol. 79, No. 3, pp. 511-514 (1997).

Ohno, et al., *(Ga,Mn)As: A new diluted magnetic semiconductor based on GaAs*, American Institute of Physics: Appl. Phys. Lett. 69 (3), pp. 363-365 (1996).

Ohno, et al., *Magnetotransport Properties of p-Type (In,Mn) As Diluted Magnetic III-V Semiconductors*, Physical Review Letters, vol. 68, No. 17, pp. 2664-2667 (1992).

Reohr, W., et al., *Memories of tomorrow*. IEEE Circuits & Devices Magazine, 2002. 18(5): p. 17-27.

Ferrand, et al., *Indication of Ferromagnetic Ordering in* $p\text{-}Zn_{1-x}Mn_xTe$. Physica B 284-288, 1177 (2000).

Ohno, H., et al., *Electric-field control of ferromagnetism*. Letters to nature, 2000. 408: p. 944-46.

* cited by examiner

POWER CONSUMPTION MINIMIZATION IN MAGNETIC RANDOM ACCESS MEMORY BY USING THE EFFECT OF HOLE-MEDIATED FERROMAGNETISM

DESCRIPTION OF RELATED ART

With the increasing popularity of computer systems, there have been considerable efforts expended on mechanisms of making these systems more efficient. Controlling the power consumption of conventional computer systems is desirable. Memories within these systems often serve as the primary source of power consumption. Conventional computer memories use dynamic random access memory, or DRAM. DRAM memories use continuous power to store bits of data, which consumes considerable power. Memories developed recently have replaced DRAM with magnetic random access memory, or MRAM.

In an MRAM chip, a constant power source is not used for data storage, which means that MRAM memories consume less power than DRAM memories. Instead, power is used only during the read-in, or encoding, process and the read-out, or decoding, process. The encoding process involves switching between different cell states logic to store either a zero or a one. In contrast, the decoding process involves detecting the cell state. Because of the considerable power involved in the decoding process for MRAM memories, they still consume a considerable amount of power, which inherently limits the efficiency of a computer system that uses MRAM chips. Consequently, there remains an unmet need in the art.

SUMMARY

A low-power memory device that uses hole-mediated ferromagnetism creates substantial advantages over conventional systems. Some of these advantages include reducing power consumption by several orders of magnitude and facilitating wireless monitoring of memory cells.

In a first implementation, a memory device is described. The memory device includes with first and second magnetic states. The material is in the first magnetic state when a contact associated with the material is at a first voltage, and the material is in the second magnetic state when the contact is at a second voltage. A conductor having an inductive voltage varies when the material changes magnetic state. The inductive voltage identifies the magnetic state of the material.

In another implementation, an electronic device is described that includes a plurality of memory cells. Each of the memory cells has a material with first and second magnetic states. The material is in the first magnetic state when a contact associated with the material is at a first voltage, and the material is in the second magnetic state when the contact is at a second voltage. A conductor is positioned proximate to and extending around the plurality of memory cells. An inductive voltage across the conductor varies when at least one of the memory cells changes magnetic state. A detection device determines the magnetic state of the memory cells based on an inductive voltage measurement.

In yet another implementation, a low power method for encoding and decoding data is described. A gate voltage is applied to a diluted magnetic semiconductor material with two magnetic states that cause the material to transition to a first state and data is encoded. A conductor is positioned proximate to the material, wherein an inductive voltage in the conductor varies as the material transitions state. The variation in inductive voltage is measured. The magnetic state of the material is determined in response to measuring the variation in inductive voltage and data is decoded.

Related methods of operation and computer readable media are also provided. Other systems, methods, features, and advantages of the invention will be or become apparent to one skilled in the art upon examination of the following figures and detailed description. It is intended that all such additional systems, methods, features, and advantages be included within this description, be within the scope of the invention, and be protected by the accompanying claims.

BRIEF DESCRIPTION OF DRAWINGS

The invention can be better understood with reference to the following figures. The components within the figures are not necessarily to scale, emphasis instead being placed upon clearly illustrating the principles of the invention. Moreover, in the figures, like reference numerals designate corresponding parts or blocks throughout the different views.

Figure 1:
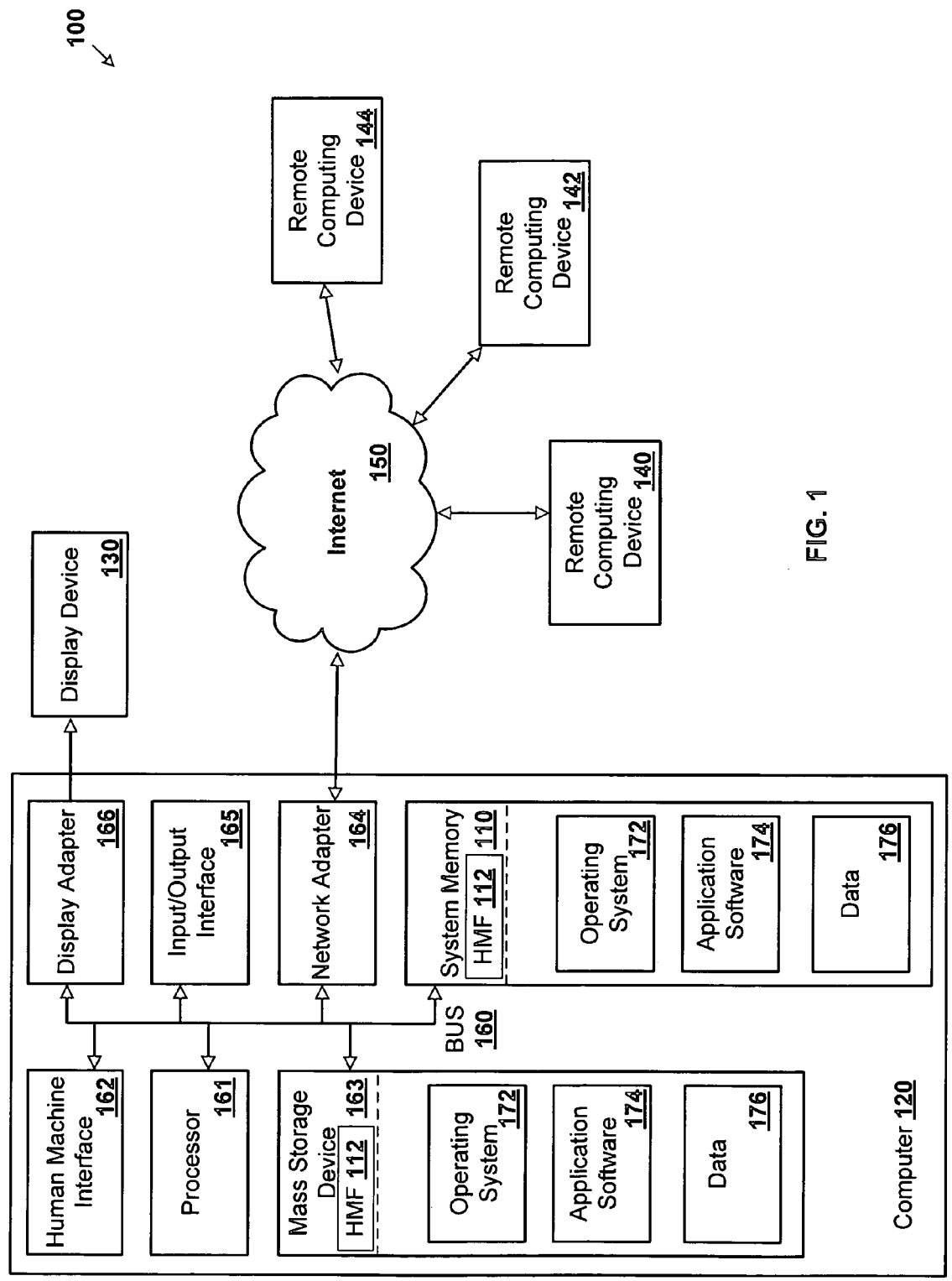
FIG. 1 is an illustrative environmental drawing for a low-power memory device with hole-mediated ferromagnetism.

While the invention is susceptible to various modifications and alternative forms, specific embodiments have been shown by way of example in the drawings and subsequently are described in detail. It should be understood, however, that the description herein of specific embodiments is not intended to limit the invention to the particular forms disclosed. In contrast, the intention is to cover all modifications, equivalents, and alternatives falling within the spirit and scope of the invention as defined by the appended claims.

DETAILED DESCRIPTION OF EMBODIMENTS

As used in the specification and the appended claims, the singular forms "a," "an" and "the" include plural referents unless the context clearly dictates otherwise. Similarly, "optional" or "optionally" means that the subsequently described event or circumstance may or may not occur, and that the description includes instances where the event or circumstance occurs and instances where it does not.

FIG. 1 is a block diagram illustrating an operating environment 100 for using a low-power memory device with hole-mediated ferromagnetism within the system memory 110. This operating environment is only an example of an operating environment and is not intended to suggest any limitation as to the scope of use or functionality of the operating environment architecture. Neither should the operating environment be interpreted as having any dependency or requirement relating to any one or combination of illustrated components.

The system memory 110 can be operational with numerous other general-purpose or special purpose computing system environments or configurations. Thus, the environment 100 can be any one of several well known computing environments, such as personal computers, server computers, laptop devices, and multiprocessor systems. Additional examples include set top boxes, programmable consumer electronics (e.g., personal digital assistants), network PCs, minicomputers, mainframe computers, distributed computing environments that include any of the above systems or devices, and the like.

The environment 100 includes several electronic devices including a general-purpose computing device in the form of a computer 120 that houses the system memory 110. To interface with a user (not shown), the computer 120 is connected to a display device 130. In addition, the computer 120 can operate in a networked environment using logical connections to one or more remote computing devices 140-144 by using the Internet 150. These remote computing devices can be located at several different physical locations.

The display device 130 can be one of several types of display devices. For example, the display device 130 can be a CRT (cathode ray tube) display, an LCD (Liquid Crystal Display), or some other suitable type of display. In addition to the display device 130, the computer 120 can connect to other output peripheral devices, such as speakers (not shown), a printer (not shown), and the like.

A user can enter commands and information into the computer 120 via one or more input devices (not shown). The input devices can include, but are not limited to, a keyboard, pointing device (e.g., a "mouse"), a microphone, a joystick, a serial port, a scanner, and the like. These and other input devices can connect to the processor 161 via the human machine interface 162, which is coupled to the system bus 160. Alternatively, this human machine interface may be connected by other interface and bus structures, such as a parallel port, game port, or a universal serial bus (USB).

Like the computer 120, the remote computing devices 140-144 can be a personal computer, portable computer, a server, a router, a network computer, a peer device, or some other suitable device. Logical connections between the computer 120 and the remote computing devices 140-144 can be made via a local area network (LAN) and a general wide area network (WAN). These networks can be wired networks, wireless networks, or the like, such as networks in offices, enterprise-wide computer networks, intranets, or on the Internet 115.

The computer 120 can include numerous components in addition to the system memory 110. For example, the computer 120 can include the system bus 160 that couples various system components to the system memory 110. Other system components can include one or more processors or processing units 161, a human machine interface 162, a mass storage device 163, a network adapter 164, input/output interface 165, and display adapter 166.

The system bus 160 represents one or more of several possible types of bus structures, including a memory bus or memory controller, a peripheral bus, an accelerated graphics port, and a processor or local bus using any of a variety of bus architectures. The architectures can include, for example, an Industry Standard Architecture (ISA) bus, a Micro Channel Architecture (MCA) bus, an Enhanced ISA (EISA) bus, a Video Electronics Standards Association (VESA) local bus, and a Peripheral Component Interconnects (PCI) bus also known as a Mezzanine bus. The system bus 160 and all buses specified in this description can also be implemented over a wired or wireless network connection. Consequently, the remote devices 140-144 can include components, such as mentioned above, connected by the system bus 160, which in effect implements a distributed computing system.

In addition, the computer 120 can include a variety of accessible computer readable media. For example, this media can include volatile media, non-volatile media, removable and non-removable media depending on the type of system component that the media is used within. For example, the mass storage device 163 can use non-volatile media for storing computer code, computer readable instructions, data structures, program modules, and other data for the computer 120. Consequently, the mass storage device 163 can be a hard disk, a removable magnetic disk, a removable optical disk, magnetic cassettes or other magnetic storage devices, flash memory cards, CD-ROM, digital versatile disks (DVD) or other optical storage, random access memories (RAM), read only memories (ROM), electrically erasable programmable read-only memory (EEPROM), and the like.

For purposes of illustration, application programs and other executable program components such as the operating system 172 are illustrated herein as discrete blocks. However, it is recognized that such programs and components reside at various times in different storage components of the computing device 120, and are executed by the data processor(s) of the computer 120. An implementation of application software 174 may be stored on or transmitted across some form of computer readable media. Computer readable media can be any available media that can be accessed by a computer. By way of example, and not limitation, computer readable media may comprise "computer storage media" and "communications media." "Computer storage media" can include volatile and non-volatile, removable and non-removable media implemented in any method or technology for storage of information such as computer readable instructions, data structures, program modules, or other data. Computer storage media includes, but is not limited to, random access memory (RAM), read only memory (ROM), electrically erasable programmable ROM (EEPROM), flash memory or other memory technology, CD-ROM, digital versatile disks (DVD) or other optical storage, magnetic cassettes, magnetic tape, magnetic disk storage or other magnetic storage devices, or any other medium which can be used to store the desired information and is accessible by the computer 120.

Any number of program modules can be stored on the mass storage device 163, including by way of example, an operating system 172 and application software 174. Each of the operating system 172 and application software 174 (or some combination thereof) may include elements of the programming and the application software 174. Data 176 can also be stored on the mass storage device 163. Data 176 can be stored in any of one or more databases known in the art. Examples of such databases include, DB2®, Microsoft® Access, Microsoft® SQL Server, Oracle®, mySQL, PostgreSQL, and the like. These databases can be centralized or distributed across multiple systems.

The system memory 110 can include computer readable media in the form of volatile memory, such as random access memory (RAM), and/or non-volatile memory, such as read only memory (ROM). The system memory 110 typically contains data such as data 176 and and/or program modules such as operating system 172 and application software 176 that are immediately accessible to and/or are presently operated on by the processor 161. As illustrated, the system memory 110 includes a HMF (hole-mediated ferromagnetic) memory device 112, which makes the system memory 110 a low-power memory device with hole-mediated ferromagnetism. The material composition and structural arrangement of the HMF memory device 112 is described in greater detail with reference to subsequent figures. Like the system memory 110, the mass storage device 163 can also include the HMF memory device 112 as illustrated.

Figure 2A:
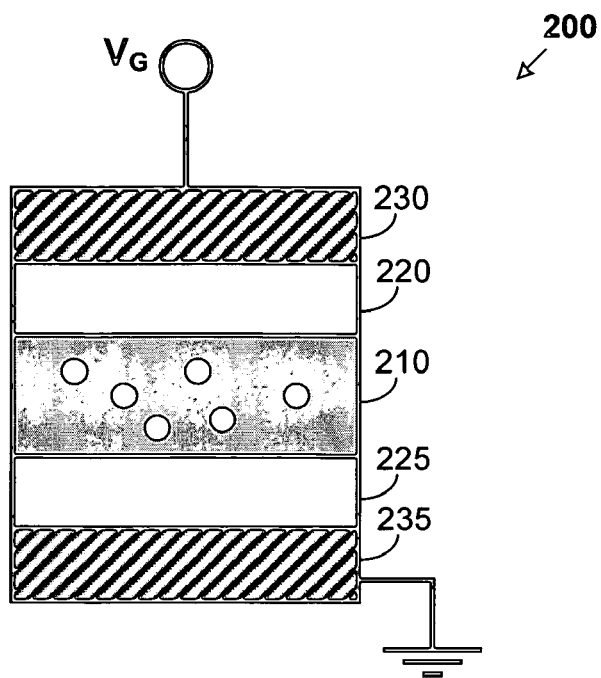
FIG. 2A is a cross-sectional view of a single cell within the memory device of FIG. 1 illustrating the structural composition the cell.

The HMF memory device 112 is formed from an array of individual memory cells. FIG. 2A is a perspective view of an individual memory cell 200 that illustrates the material structure of this HMF device. This cell includes a semiconductor layer 210 of a diluted magnetic semiconductor (DMS) material with a magnetic phase associated with hole-mediated ferromagnetism, which is subsequently described. A ferromagnetic phase is one where the magnetic moments of the atoms within a material point in the same direction and are aligned with the axis of the crystal. In contrast, a paramagnetic state is a state where the magnetic moment of the atoms point in random directions. When the individual cell 200 is in the ferromagnetic phase, it is suitable for encoding binary information, or data, using the orientation of the spins.

The individual memory cell 200 is formed from a semiconductor layer 210 positioned between two insulator layers 220, 225. Two metal layers 230, 235 are positioned proximate the respective insulator layers 220, 225. The metal layers 230, 235 can be formed from a metal suitable for production, such as aluminum, gold, or the like. The insulator layers 220, 225 can also be formed from a material suitable for production, such as silicon dioxide or the like.

The semiconductor layer 210 can be formed from a variety of materials, such as a diluted magnetic semiconductor (DMS) material. A DMS is a semiconductor in which one or more positive ions, or cations, of a semiconductor are partially substituted by a magnetic ion. Examples of DMS materials can include the following: gallium manganese arsenic alloys, gallium manganese nitride alloys, and the like.

Because the individual memory cell 200 should operate at room temperature, the Curie temperature of the material that forms the semiconductor layer 210 should be above room temperature. The Curie temperature is the temperature above which a ferromagnetic material loses its ferromagnetic properties, which is dependent upon the dopants within the semiconductor. Consequently, materials for the semiconductor layer 210 are selected based on having curing Curie Temperatures above room temperature.

Injecting holes, or positively charged particles, into ionic materials can result in magnetizing those ions. For example, injecting holes into a material, such as $Ga_{1-x}Mn_xAs$ can result in magnetizing the managanese (Mn) ions. However, injecting holes also increases the hole concentration in the material. The Curie temperature is a function of the concentration of holes and the transition from anti-ferromagnetic state to a ferromagenetic state occurs when the hole density is on the order of $10^{20} cm^{-3}$. Achieving this hole density, which facilitates the transition to a ferromagnetic state, can be achieved by limiting the area of the individual memory cell 200.

The individual memory cell 200 can be designed such that its dimensions are quite small, which means minimum power consumption. The overall thickness can be much less than 2 µm. For example, the metal layers 230, 235 can have thicknesses of 300 nm, 200 nm, 100 nm, or some other suitable thickness. The insulator layers 220, 225 can have a thickness of 100 nm, 200 nm, 300 nm, or some other suitable thickness. A suitable thickness for these insulator layers is a thickness that is sufficient in confining holes to the DMS material within the semiconductor layer 210. The thickness of the semiconductor layer 210 can range from hundreds of nanometers up to tens of nanometers. There is a potential for further scaling up the thickness of the semiconductor layer 210 to a single atomic layer. Even if the upper ranges are chosen for each layer, the overall cell thickness is only slightly above one micron. In addition, the area of the individual memory cell 200 can be selected such that it is sufficient for signal detection. For example, the area can be approximately 95 nm×95 nm, 100 nm×100 nm, 110 nm×110 nm, or the like.

A gate voltage $V_G$ applied across the individual memory cell 200 (i.e., applied to a top contact 230) controls the hole concentration in the semiconductor layer 210. When $V_G$ is negative, the hole concentration in this layer increases, which enhances the ferromagnetic interaction among magnetic ions. In contrast, applying a positive $V_G$ decreases the hole concentration, which destroys the ferromagnetic interaction. Thus, the total magnetization M of the individual memory cell is a function of the applied gate voltage $V_G$.

Figure 2B:
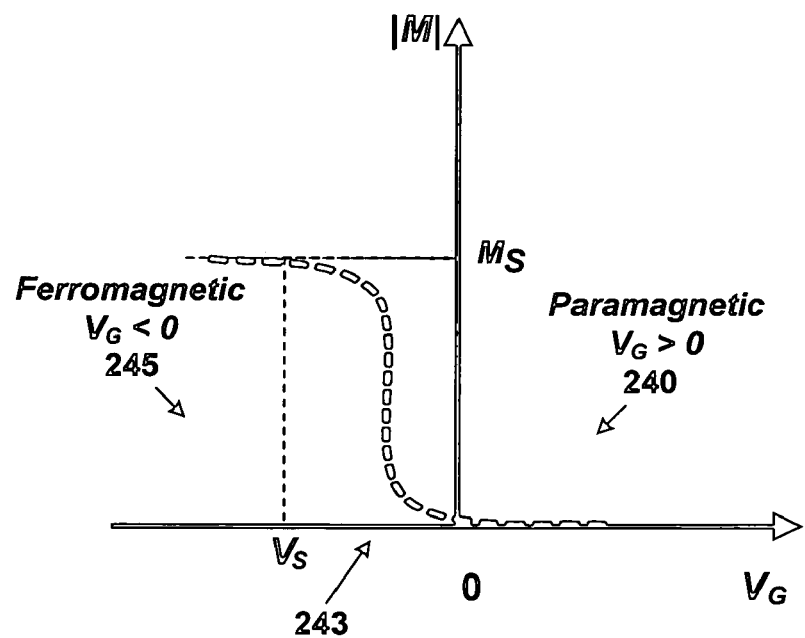
FIG. 2B is a graph illustrating the variation of the magnetic moment of the memory cell of FIG. 2A with applied voltage.

FIG. 2B is a graph illustrating the variation of the magnetization with varying gate voltage $V_G$. More specifically, this graph illustrates the absolute value of the magnetization |M| as a function of the gate voltage $V_G$. When $V_G$ is greater than zero (i.e., region 240), |M| is approximately zero, which corresponds to one logic state. When $V_G$ is greater than a saturation voltage $V_S$, the |M| is approximately $M_S$, which is the saturation value for the magnetization M. Because |M| stays at approximately $M_S$ for all voltages beyond $V_S$ (i.e., region 245), $M_S$ corresponds to a second logic state. The region between 0 and $V_S$ corresponds to a phase transition region 243 where the absolute value of the magnetization |M| is a function of the gate voltage $V_G$. This region corresponds to an anti-ferromagnetic phase or paramagnetic phase. Because the individual memory cell 200 has two ferromagnetic phases corresponding to regions 240, 245, this cell is suitable for information encoding and use as a memory cell.

Figure 3:
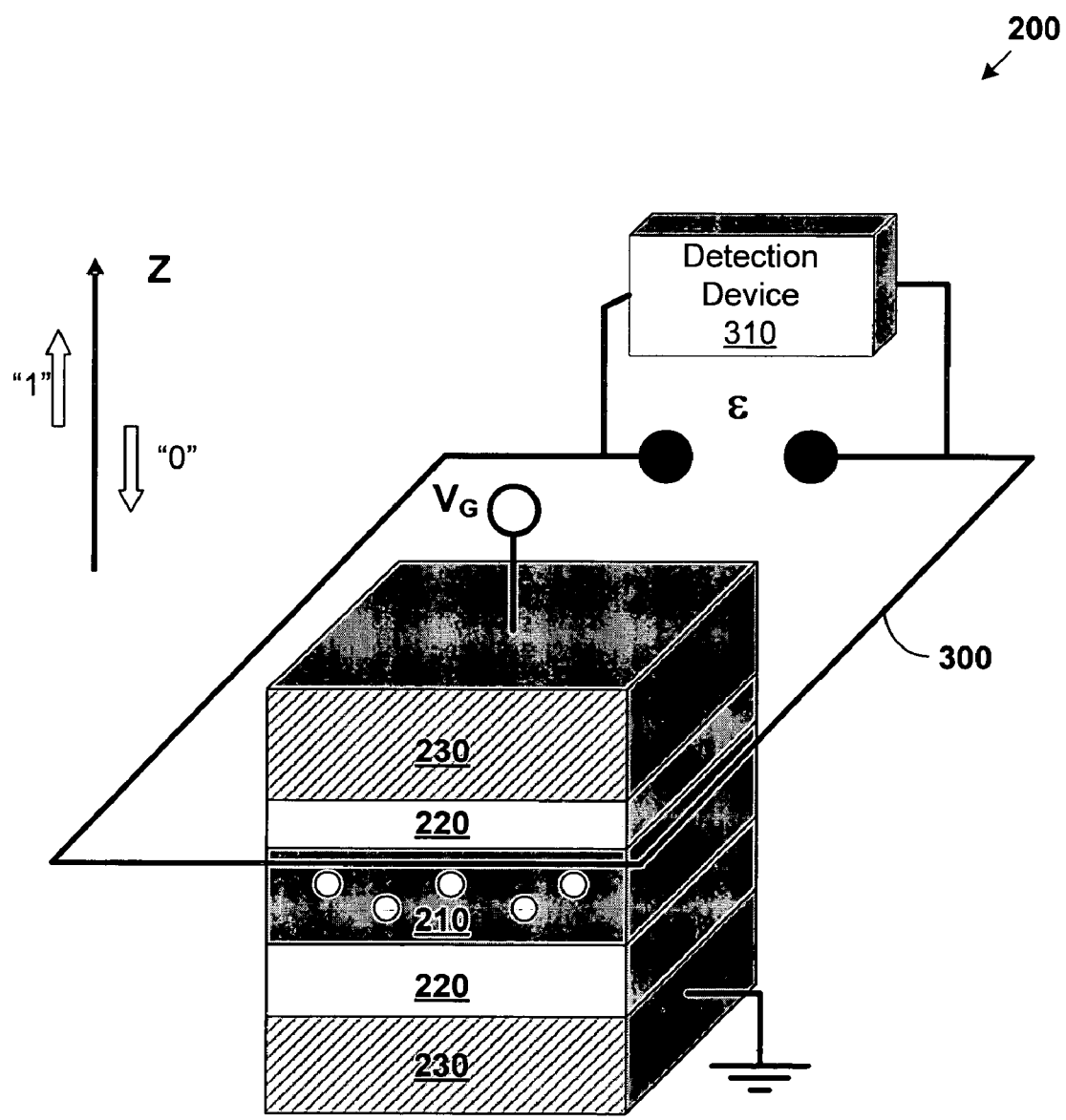
FIG. 3 is a perspective view of the memory cell of FIG. 2A illustrating a conducting wire for detecting the inductive voltage produced by the memory cell.

Hole mediated ferromagnetism can also be used in decoding data encoded in one of the logic states described with reference to FIG. 2B. Turning now to FIG. 3, this figure is a perspective view of the individual memory cell 200 illustrating a conductor 300 for detecting the inductive voltage produced by this memory cell. The presence of this conductor facilitates decoding of the data by using an inductive voltage measurement technique. Combining the effect of hole-mediated ferromagnetism with inductive voltage measurements enables the creation of the low-power magnetic random access memory cell 200. Varying the concentration of holes within the individual memory cell 200 using the gate voltage VG changes the cell's magnetic moment. This change produces a variation in magnetic flux through the conductor 300.

The change of the magnetic flux through the area of the conductor 300 generates an inductive voltage. According to the Faraday's Law, the change of the magnetic flux is governed by the equation $$\varepsilon = -\frac{d\Phi}{dt}$$

where $\Phi$ is the magnetic flux, t is the time, and $\varepsilon$ is the inductive voltage in the conductor 300. Since there is not an external magnetic field present when the inductive voltage is determined, the individual memory cell 200 is considered uniformly magnetized. The magnetic flux Φ is determined by the following equation $$\Phi = \int_S B dS_n \approx \mu_0 MS$$

where $\mu_0$ is the permeability constant, M is the magnetization, and S is the surface area of the individual memory cell 200. The spin relaxation time τ defines the speed of the change in magnetic flux Φ.

Thus, the inductive voltage within the conductor 300 associated with the magnetization change of the individual memory cell 200 is expressed as follows:

$$\varepsilon \approx -\frac{\mu_0 M_s S}{\tau} e^{-t/\tau}.$$

A detection device 310 can measure the inductive voltage as well as variations in the inductive voltage ε. This detection device can be any type of digital of analog voltmeter, digital voltmeter, galvanometer, or the like. The sensitivity and time response constant of the detection device 310 should be sufficient to detect the inductive voltage ε.

The magnitude of the inductive voltage is proportional to the square of the cell, which leaves a possibility for signal enhancement. When the memory cell zoo surface area is S=200 nm×200 nm, the inductive voltage is four times as large as when S=100 nm×100 nm. This relationship makes measuring the inductive voltage ε easier.

Using sample measurements it is possible to determine potential values for the inductive voltage ε. If the semiconductor layer 210 is formed from a MnGaAs film of 100 nm thickness, the saturated magnetization $M_S$ is 400 ×10³ A/m. When the surface area S=100 nm×100 nm, τ=1 ps, $\mu^0$=1.26× $10^{-6}$ Wb/A, then the maximum inductive voltage ε=5.04 mV. The sign of the inductive voltage depends on the cell's polarization (i.e., whether the state corresponds the region 240 or the region 245). Hence, the logic state for the individual memory cell 200 can be recognized by the sign of the measured inductive voltage. For example, ε=0.5 mV>0 and corresponds to the state "1", and ε=−0.5 mV <0 corresponds to the state "0". The detection device 230 can make this kind of determination.

The power consumption of the individual memory cell 200 is defined by the energy used in either injecting or dejecting holes from the semiconductor layer 210. The energy dissipation for one carrier, such as a hole, between two quantum wells is governed by the following equation:

$$E_{dissip} = \frac{1}{2}\alpha\tau + kT\ln 2$$

where α is the speed of the changing the potential difference between the wells and k is the Boltzmann constant. The $\frac{1}{2}\alpha\tau$ term provides the greatest contribution to power consumption when the switching time is on the order of hundreds of picoseconds or less. Despite the considerable impact of this first term, energy used for a single hole injection is approximately 0.05 eV (i.e., 0.08 ×$10^{-19}$) when α=$10^{11}$ eV/s.

Using the dissipated energy $E_{dissip}$ per single hole injection, it is possible to calculate the total energy. The total energy is estimated as the product of the number of holes used for the phase transition on the energy dissipation associated with one hole injection as illustrated in the following equation:

$$E \approx N_h \times E_{dissip} = \frac{n_h}{V} \times E_{dissip}$$

where $n_h$ is the hole density. When $n_h$ is on the order of $10^{20}$ cm$^{-3}$ and the volume is 100 nm×100 nm×100 nm, the total energy E≈8×$10^{-16}$ J. This value is approximately four orders of magnitude less than some of the best conventional devices. The energy savings can be even greater for DMS materials that use an even lower hole concentration, such as materials where the hole concentration for the paramagnetic to the ferromagnetic transition is $10^{19}$ cm$^{-3}$, $10^{18}$ cm$^{-3}$, or the like.

Figure 4:
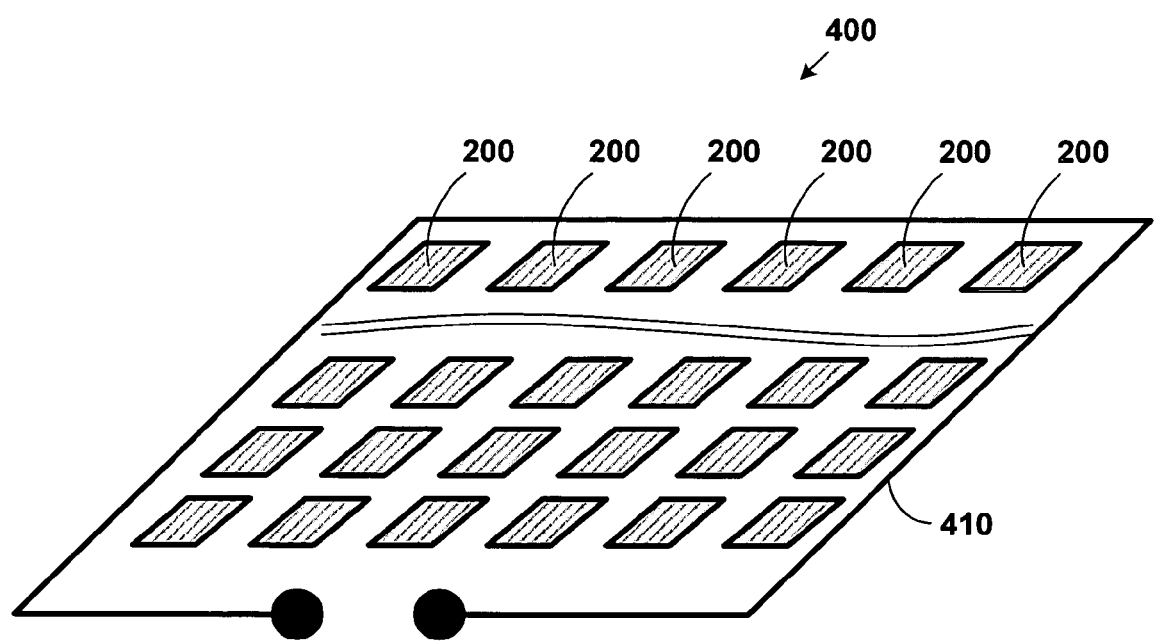
FIG. 4 is a block diagram of the memory device of FIG. 1 illustrating an array of the memory cells of FIG. 2A with a single conducting wire.

In addition to the substantial reduction in power consumption, the novel low power memory device with hole-induced ferromagnetism includes other advantages. Because the system uses inductive voltage measurements, the individual memory cell 200 can be monitored wirelessly, which is more clearly seen with reference to FIG. 4. An array 400 of individual memory cells can be controlled by a single gate voltage $V_G$ and conductor 410. This conductor can be used for decoding, as previously described, as well as encoding. For encoding, the magnitude of the magnetic field produced in the conductor 400 is only enough to change the polarization of the memory cell 200 in the region 243 but not sufficient to change the polarization of the cell in region S240, S245 (See FIG. 2B). This is accomplished by causing the magnitude of the read-in field to be enough to define the polarization of the DMS material in the region 243 (hole concentration is less than $10^{20}$) but not sufficient to change the polarization of the cells already in the ferromagnetic state (hole concentration is $10^{20}$). Hence, each individual memory cell 200 within the array 400 is only sensitive to the external magnetic field in the conductor 410 when it is in the transitional phase 243, but is otherwise insensitive. This is accomplished because at the gate voltage Vs the cell is not sensitive to the read-in field. The sensitivity only occurs where Vs<Vg<0. In addition, using the inductive voltage measurement also reduces the number of interconnects.

While various embodiments of the invention have been described, it may be apparent to those of ordinary skill in the art that many more embodiments and implementations are possible that are within the scope of this invention. For example, while illustrated with advertising commissions, the invention is applicable to any type of commissions. All such modifications are intended to be included within the scope of this disclosure and the present invention and protected by the following claims.

What is claimed is:

1. A memory device, comprising:
    a material with first and second magnetic states, wherein the material is in the first magnetic state when a contact associated with the material is at a first voltage, and the material is in the second magnetic state when the contact is at a second voltage, and the first voltage is a positive voltage and the second voltage is a negative voltage; and a conductor having an inductive voltage that varies when the material changes magnetic state; wherein the magnetic state of the material is determined in response to measuring the variation in the inductive voltage and data is decoded based upon the magnetic state of the material.

2. The memory device of claim 1, wherein a detection device is coupled to the conductor and operative for making an inductive voltage measurement, and the inductive voltage measurement indicates whether the material is in the first magnetic state or the second magnetic state.

3. The memory device of claim 1, wherein the material is a diluted magnetic semiconductor material.

4. The memory device of claim 3, wherein the diluted magnetic semiconductor material is selected from the group consisting of gallium manganese arsenide alloys and gallium manganese nitride alloys.

5. The memory device of claim 1, wherein the conductor is selected from the group consisting of gold and aluminum.

6. The memory device of claim 1, wherein the power consumed by the memory device is on the order of a few thousand electron volts.

7. The memory device of claim 1, wherein the memory device is magnetic random access memory.

8. An electronic device, comprising:
a plurality of memory cells, each of the memory cells having a material with first and second magnetic states, wherein the material is in the first magnetic state when a contact associated with the material is at a first voltage, and the material is in the second magnetic state when the contact is at a second voltage;

a conductor positioned proximate to and extending around the plurality of memory cells, wherein an inductive voltage across the conductor varies when at least one of the memory cells changes magnetic state; and a detection device for determining the magnetic state of the memory cells based on an inductive voltage measurement.

9. The electronic device of claim 8, wherein the electronic device is selected from the group consisting of a mass storage device, system memory, a computer system, and a personal digital assistant.

10. The electronic device of claim 8, wherein the electronic device is implemented with a plurality of remote devices.

11. The electronic device of claim 8, wherein the conductor is a metal loop selected from the group consisting of gold and aluminum.

12. The electronic device of claim 8, wherein the material is a diluted magnetic semiconductor material.

13. The electronic device of claim 8, further comprising a processor, system memory, an operating system and application software.

14. A low power method for encoding and decoding data, the method comprising the steps of:
applying a gate voltage to a material with first and second magnetic states, wherein the material is in the first magnetic state when a contact associated with the material is at a first voltage, and the material is in the second magnetic state when the contact is at a second voltage;

positioning a conductor proximate the material, wherein an inductive voltage in the conductor varies as the material transitions state;

measuring the variation in inductive voltage; and determining the magnetic state of the material in response to measuring the variation in inductive voltage and data is decoded.

15. The method of claim 14, wherein the material is within a memory cell.

16. The method of claim 15, further comprising wirelessly monitoring the memory cell.

17. The method of claim 14, wherein applying a gate voltage comprises applying a positive gate voltage.

18. The method of claim 17, further comprising applying a negative gate voltage that causes the material to transition to the second state.

19. The method of claim 18, wherein determining the magnetic state comprises determining whether the material is in the first or the second magnetic state.

* * * * *